United States Patent [19]

McKee

[11] Patent Number: 4,761,582

[45] Date of Patent: Aug. 2, 1988

[54] DUAL MODE TRANSDUCER

[75] Inventor: John M. McKee, Coral Springs, Fla.

[73] Assignee: Motorola, Inc., Schaumburg, Ill.

[21] Appl. No.: 27,984

[22] Filed: Mar. 19, 1987

[51] Int. Cl.$^4$ ............................................. H01L 41/08
[52] U.S. Cl. ..................................... 310/322; 310/324; 310/339; 310/317
[58] Field of Search ............... 310/338, 339, 317, 321, 310/322, 324

[56] References Cited

U.S. PATENT DOCUMENTS

| | | | |
|---|---|---|---|
| 3,464,531 | 9/1969 | Herr et al. | 310/339 X |
| 3,976,899 | 8/1976 | Fanshawe | 310/339 |
| 4,185,621 | 1/1980 | Morrow | 310/339 X |
| 4,240,002 | 12/1980 | Tosi et al. | 310/324 |
| 4,373,119 | 2/1983 | Feder | 310/324 X |
| 4,374,377 | 2/1983 | Saito et al. | 310/324 X |
| 4,580,074 | 4/1986 | Gilman | 310/339 |

Primary Examiner—Mark O. Budd
Attorney, Agent, or Firm—Winfield J. Brown, Jr.; Joseph T. Downey; Anthony J. Sarli, Jr.

[57] ABSTRACT

An electroacoustic transducer such as a piezoelectric element transducer includes an output mode for generating an alert signal and an input mode for generating a switching signal. The transducer comprises an actuating means, such as a pushbutton, a resilient member, such as a snap action dome, a housing and a piezoelectric element. In the output mode, voltage is supplied to the piezoelectric element to generate mechanical vibrations which are converted to acoustical energy by a resonant cavity and port in the housing. In the input mode, manual pressure on the pushbutton forces the dome, being interposed between the pushbutton and piezoelectric element to collapse and deform the piezoelectric element. In response, the piezoelectric element generates an electrical signal. A voltage sensing circuit senses the electrical signal and generates an input signal. The circuit distinguishes between the voltage supplied to the piezoelectric element to generate mechanical vibrations and the electrical signal generated by the collapsed dome.

23 Claims, 5 Drawing Sheets

DUAL MODE TRANSDUCER

BACKGROUND OF THE INVENTION

1. Field of the Invention

This invention relates to electroacoustic transducers, and more particularly, to a dual mode piezoelectric transducer and method for generating an alerting signal in an output mode and providing a switching signal in an input mode.

2. Background Discussion

Piezoelectric transducers have been increasingly used in signalling devices such as communication receivers, watches, and other alerting apparatus which employ a single tone alert signal. These transducers generate an acoustic alert signal when stimulated by an electrical voltage. Examples of such transducers are those described in U.S. Pat. Nos. 4,413,198 and 4,240,002. One problem with such alerting transducers is that they occupy relatively large amounts of space compared to the actual electronic circuitry required to operate these signalling devices. Thus, as modern signalling devices become smaller, the alerting transducer size becomes an increasing problem. Another problem with these alerting transducers is that they provide only an output alert signal.

Additionally, numerous types of switches have also been employed on these signalling devices to provide inputs to the processing circuitry. Examples of such prior art input switches are those disclosed in U.S. Pat. Nos. 3,643,041 and 3,684,842. One problem with using electronic switches is that they must constantly be powered from an extrinsic power supply for detecting a change in their switch status. Even when the switch is used as an on/off switch, power is continuously supplied from the signalling devices power supply such as a battery. Thus, when the user turns off his device and stores it for a long period of time, the battery will eventually become discharged.

In some applications, it is desirable to consense battery energy by having a switching device which provides an electrical signal which operates to turn on the prorcessing circuitry in the absence of any extrinsic power. I would also be highly desirable to conserve space by combining in one transducer the function of a switch and an alert signal generator.

BRIEF SUMMARY OF THE INVENTION

In accordance with the present invention, there is provided an apparatus and method for alleviating the aforementioned problems of the prior art devices. Accordingly, the invention has as one of its objects a dual mode transducer for generating an alert signal in an output mode and providing a switching signal in an input mode.

Another aspect of the present invention is to combine a switching assembly in an alert signal generator to conserve space in a small portable electronic device.

Another object of the present invention is to provide a transducer apparatus for activating a communication receiver or the like which requires only energy generated from the transducer.

In general, the present invention relates to a dual mode transducer comprising an actuating means, a resilient member, a housing, and a piezoelectric element. In the output mode, voltage is supplied to the piezoelectric element for generating mechanical vibrations in the piezoelectric element. The housing supporting the piezoelectric element includes a resonant cavity and port which convert the mechanical energy to acoustic energy. The port radiates the acoustic energy to generate an alert signal.

In the input mode, the actuating means, such as a pushbutton, manually applies pressure to the resilient member. The resilient member, such as a snap action dome, being responsive to the pushbutton is interposed between the pushbutton and the piezoelectric element. The manual pressure on the pushbutton forces the snap action dome from a normal undeflected position to deflected position, where the snap action dome returns to the undeflected position upon removal of the manual pressure. The deflected dome deforms then piezoelectric element to generate an electrical signal. A voltage sensing circuit senses the electrical signal to produce an input signal for associated electronic processing circuitry.

The voltage sensing circuit includes a voltage measuring device to distinguish between the voltage supplied to generate an output alert signal and the electrical input signal generated by the action of the snap action dome. In one embodiment, the voltage measuring device operates from the power supply of the processing circuitry. In a second embodiment, the voltage measuring device operates from the voltage generated by the piezoelectric element.

DETAILED DESCRIPTION OF A PREFERRED EMBODIMENT

Figure 1:
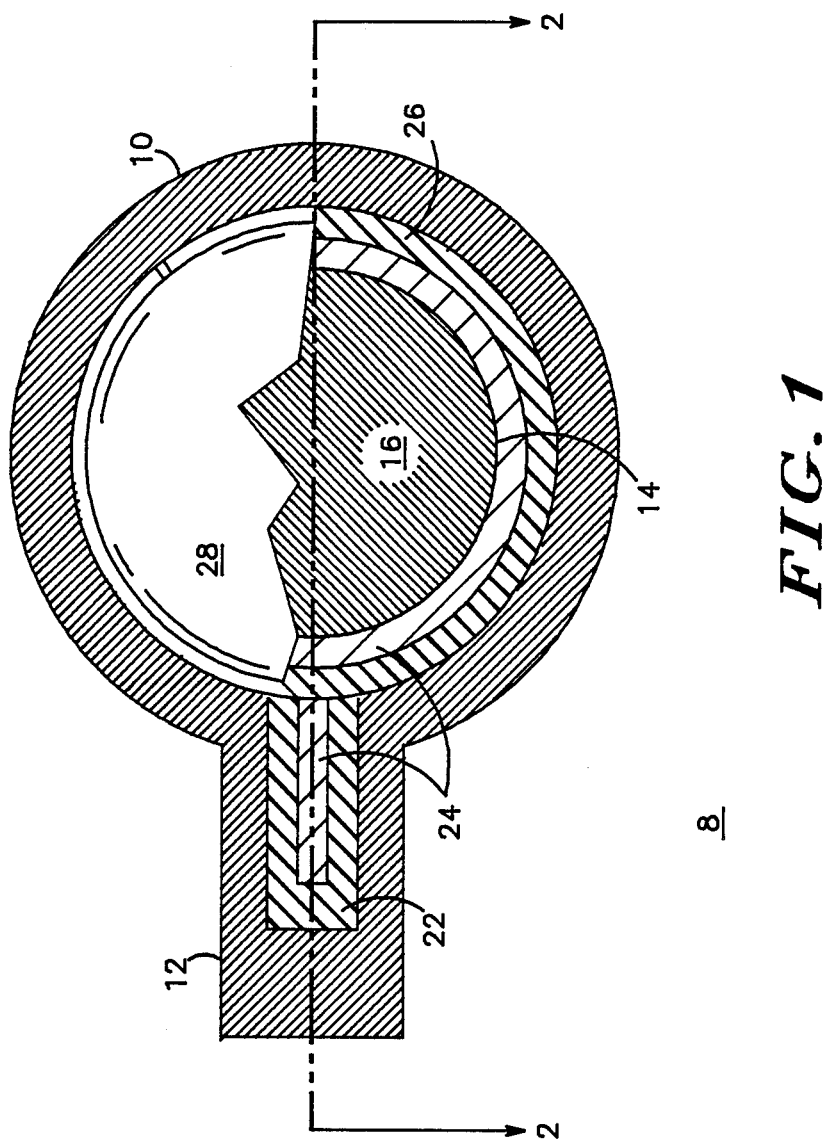
FIG. 1 is a plan view of the piezoeleotric transducer of the present invention showing a view of the piezoelectric driver with part of the snap action dome removed to show the piezoelectric element.

In order to best illustrate the utility of the present invention, it is described in conjunction with a communication receiver, such as a paging receiver, capable of receiving and decoding encoded information. While the present invention is described hereinafter with particular reference to a paging receiver, it is to be understood that the apparatus and methods, in accordance with the present invention, may be used with numerous other signalling devices such as watches, calculators, or the like.

Referring to the figures in general, there is illustrated a dual mode piezoelectric transducer 8 having a piezoelectric element 14 for operating as a signalling device and as a switch. In the signal alerting or output mode, the transducer 8 is driven by an AC signal source 48 which provides electrical energy to excite the transducer 8 into mechanical vibration. The transducer 8 is mounted in a housing 34 which includes a cavity 36 and a port 38 which function as a Helmholtz resonator. When electrically excited, the transducer 8 is induced into mechanical vibration and generates acoustic signals having the majority of the frequency components at the resonant frequency of the cavity and port.

In the switching or input mode, a resilient member, such as a snap action dome 28, is mounted above the piezoelectric element 14. An actuating means, such as a pushbutton 40, when manually operated, forces the dome from an undeflected normal position to a deflected position which contacts and mechanically deforms the piezoelectric element 14. In response to the deformation, the piezoelectric element 14 outputs a voltage which is sensed by a voltage sensing circuit 50 to activate the electronic circuitry of the paging receiver.

In one embodiment of the present invention, the voltage sensing circuit 50 comprises a voltage measuring device 52 which requires power from the power supply for sensing a signal from the piezoelectric element. In this embodiment, the transducer 8 performs as a switch. In a second embodiment of the present invention, the voltage measuring device 54 comprises a voltage measuring device which senses the voltage from the piezoelectric element to activate a series of transistor switches for activating power to the electronic circuitry. The second embodiment requires no extrinsic power for sensing the piezoelectric element. Thus, even when the paging receiver is turned off, no power is drained from the batteries.

Figure 2:
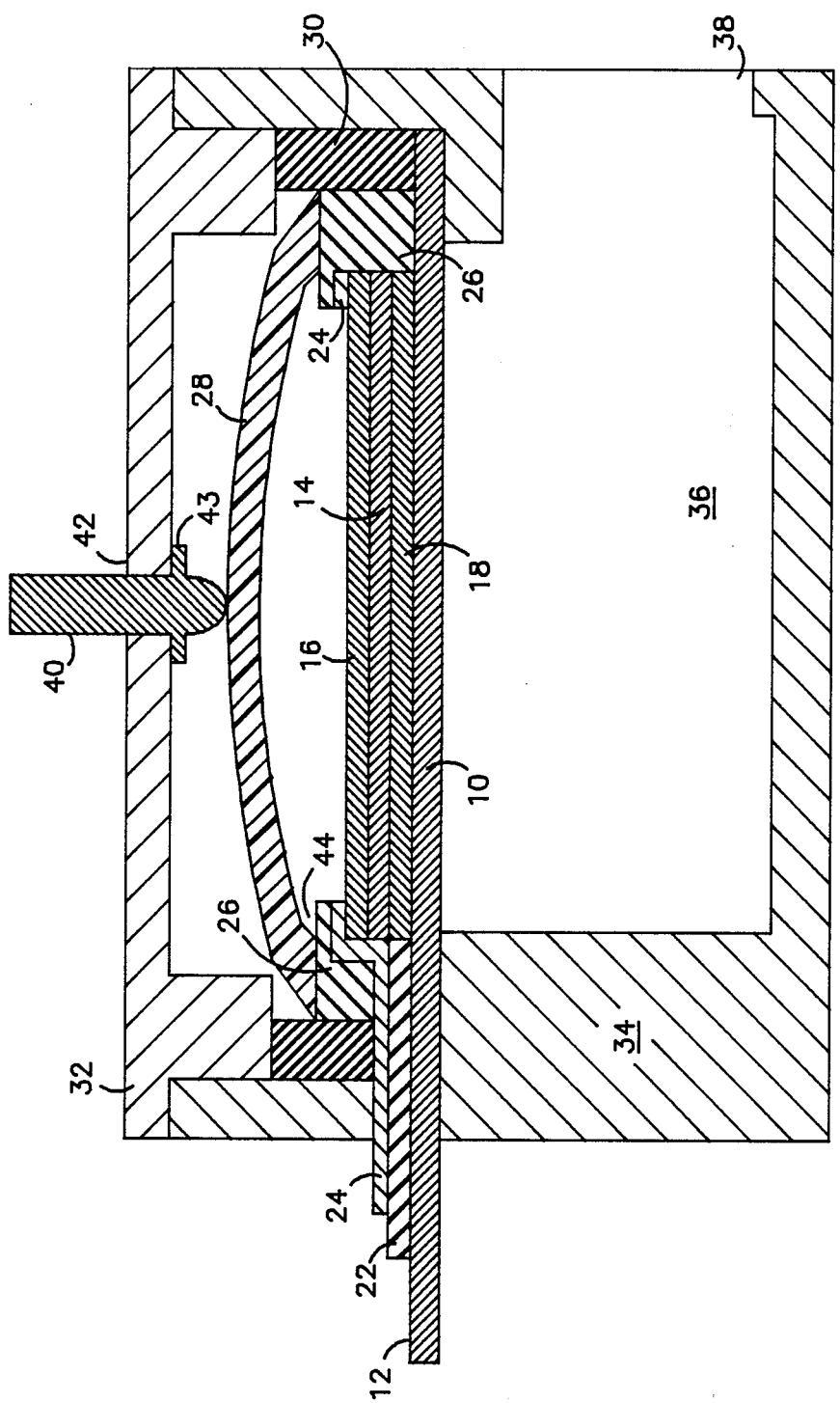
FIG. 2 is a cross section view taken along line 2—2 of FIG. 1.

Referring in particular to the plan view of FIG. 1 and the cross sectional view of FIG. 2, there is shown an embodiment of the dual mode transducer 8 including a diaphragm 10 having a single projecting tab 12. A diaphragm 10 is formed of a thin resilient metal. An electromechanical driver, preferably a piezoelectric disk 14, with electrode 16 and 18 formed on opposing faces is attached to diaphragm 10. The electrodes 16 and 18 may be of a vapor deposited nickel. A prefom of non-conducting epoxy (not shown) may be used as the cement since, under the heat and pressure of the curing process, the epoxy is absorbed into the surface of the piezoelectric element 14 and the lower electrode 18 is in direct electrical contact with diaphragm 10. The element 14 is preferably of the type of ceramics which can be "poled" or made piezoelectrically active by application of appropriate voltage across the material, but the invention is not so limited. After the element 14 is attached to the diaphragm 10, an insulating area 22 is screened onto diaphragm 10 adjacent the element 14 and covering at least a portion of the tab 12. The insulating material is preferably a screened on polymer.

A second screening process places a conductive layer 24 over at least a portion of the upper electrode 16 and over only a portion of the insulating area 22 including the insulated portion of tab 12. The material of the conductive layer 24 is preferably a silver epoxy. The layer 24 may cover the entire surface of the upper electrode 16 or only a part, the only requirement being that a low resistance connection be made to the electrode 16.

A third screening process places an insulating area 26 over the conductive layer 24. A resilient material 28 covers and surrounds the piezoelectric element 14. The insulated area 22 and 26 extend around the entire periphery of the piezoelectric element 14 so that at no point does the conductive layer 24 make electrical contact with the diaphragm 10 or the resilient material 28.

Also indicated in FIG. 1 and FIG. 2, is a position of a resilient O-ring or washer 30 which may be used to provide a front-to-back seal within the cavity formed by a mounting element 32 and housing 34. The mounting element 32 and housing 34 would preferably be formed of a molded plastic and are structurally attached. The housing 34 includes a resonant cavity 36 and port 38. The cavity 36 dimensions and port 38 placement and dimensions are determined by the desired frequency response in the output mode and in an apparatus such as a paging receiver, the cavity 36 would comprise a portion of the apparatus housing itself. The tab 12 extends out of the cavity 36 for easy connector access and electrical connections. In the output mode, a voltage supplied to the piezoelectric element 14 generates mechanical vibration which is converted to acoustical energy by cavity 36 and port 38. For a more detailed explanation of the operation of the electromechanical driver in the output mode as an alerting device, reference is made to U.S. Pat. No. 4,240,002 assigned to the assignee of the present invention, the disclosure of which is hereby incorporated by reference.

The resilient material in the form of a snap action dome 28 is in contact with an actuating means such as pushbutton 40. The snap action dome 28 is interposed between the pushbutton and piezoelectric element 14. The mounting element 32 having an aperture 42 formed therethrough effects slidable movement of the pushbutton 40. In the input mode, the pushbutton 40 is manually forced down on the apex of the snap action dome 28 which provides a noticeable snap immediately before the dome's center becomes coplanar with its periphery when it is deflected and immediately returns from being coplanar when released. When the dome deflects, it contacts and deforms the piezoelectric element 14, generating an electrical signal.

In the normal undeflected position, the apex of the dome forces the pushbutton 40 in an upward direction until a radially extending flange 43 on pushbutton 40 contacts the inner surface of mounting element 32. The periphery of the dome 28 includes a peripheral foot portion 44 formed at an angle to the adjacent surface of the domed portion for effecting the snap action of the dome 28. The foot portion 44 extending around the periphery of the dome allows the inner surface of the dome 28 to forcefully contact the piezoelectric element 14 for generating a measurable voltage from the piezoelectric element 14. The foot portion 44 also increases the stress on the piezoelectric element from the contact of dome 28. In practice, the dome 28 is positioned by the housing 34 and a positioning element, such as washer 30, to maximize the voltage from deforming the piezoelectric element 14. The dome 28 may be comprised of metal or other resilient material such as plastic.

Figure 3:
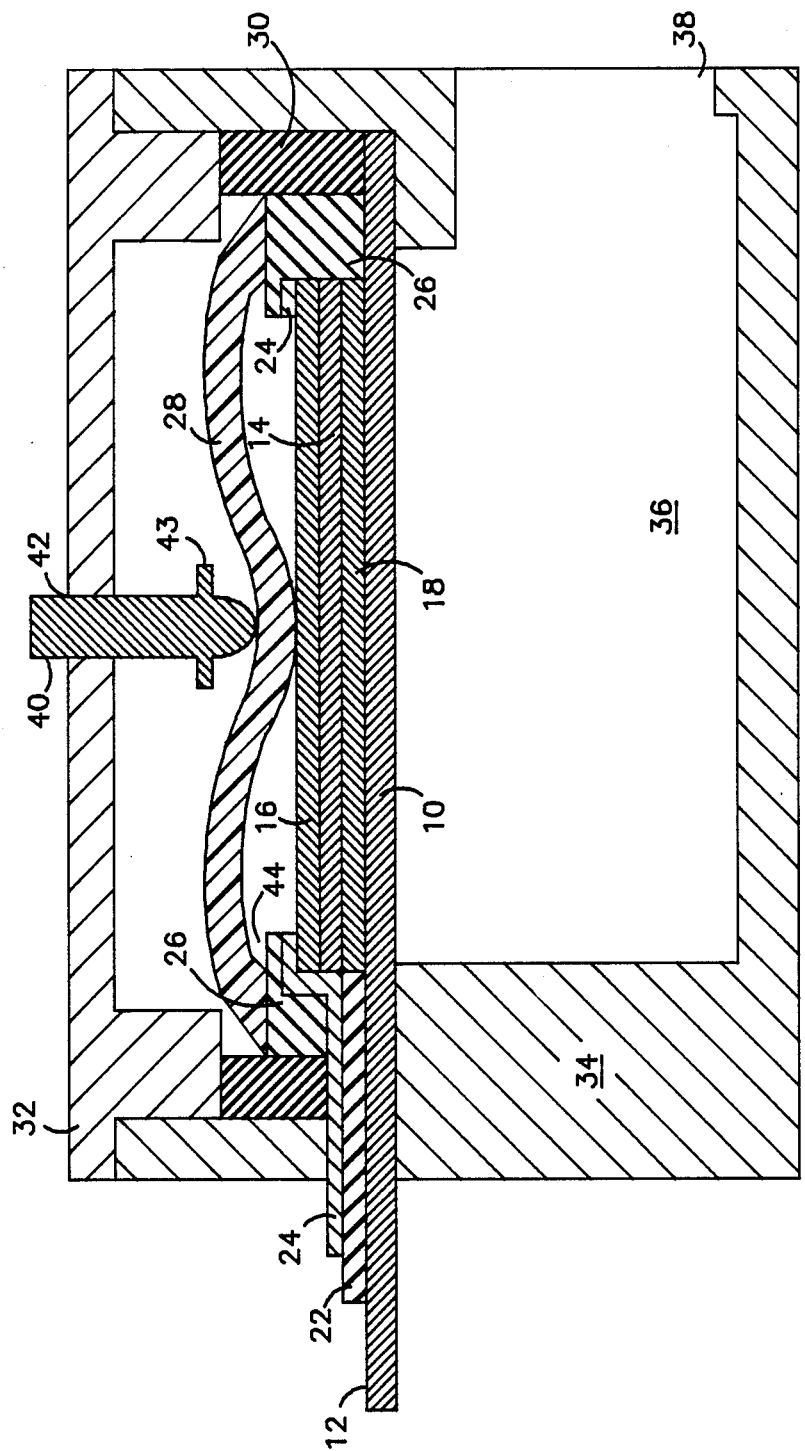
FIG. 3 is a cross section of FIG. 1 taken along line 2—2 showing the deformation of the snap action dome of the transducer assembly

Referring to FIG. 3, there is shown the deflection of dome 28 upon pushbutton 40 applying force in a downward direction. When the center of the dome becomes coplanar with its periphery, the dome becomes deflected as shown in FIG. 3 which deforms the piezoelectric element 14. Essentially, the dome has two positions; a first position of equilibrium as shown in FIG. 2, and a second position as shown in FIG. 3. The dome remains in the first position with substantially constant contact pressure on the pushbutton 40. The dome begins in the first position, and with substantially constant contact pressure from the pushbutton 40, reaches a point at which stored energy in the dome causes the dome to move abruptly to the second position. The dome remains in the second position with constant pressure on the piezoelectric element 14 until the force applied from the pushbutton 40 is removed wherein the dome "snaps" back to the first position. In the second position, the piezoelectric element 14 generates an electrical signal when subject to the rapid mechanical deformation by the deflected dome.

Figure 4:
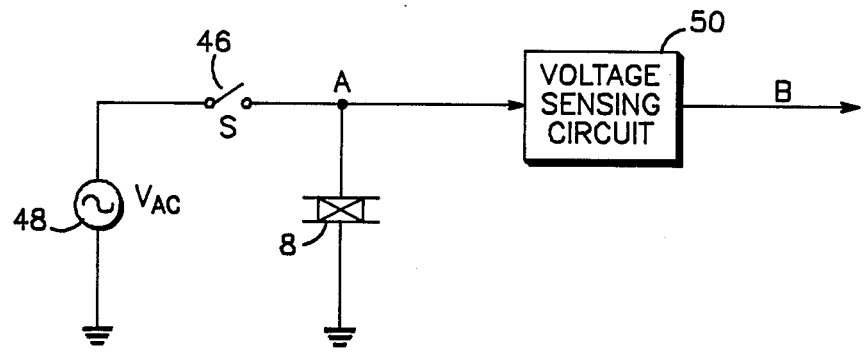
FIG. 4 is an electrical diagram showing a voltage sensing circuit capable of providing an electrical signal in response to activation of the piezoelectric element in the switching mode.

FIG. 4 illustrates an electrical diagram of the operation of the piezoelectric element transducer 8 in an output mode and in an input mode. In the output alerting mode for a paging receiver, the electronic circuitry of the paging receiver enables a switch 46 which provides a variable voltage ($V_{AC}$) across the piezoelectric transducer 14. The operation of a paging receiver is well known and the operation of a typical paging receiver may be found in U.S. Pat. No. 4,518,961. The AC signal source 48 provides electrical energy to excite the piezoelectric element 14 into mechanical vibration. When mounted in the housing, and when electrically excited, the piezoelectric element 14 is induced into mechanical vibration and generates acoustic signals from the housing port. The cavity and port cooperate to form a resonant structrure or a Helmholtz resonator which radiates acoustic energy out the port.

In the input mode, the switch 46 is typically opened. When the pushbutton applies force to the dome, the dome responds to the downward pressure to flex downwardly, into stressful contact with the underlying piezoelectric element. The deformation of the piezoelectric element from the contact with the dome generates an electrical signal in response to the inner surface of the dome collapsing onto the piezoelectric element. This voltage which is greater than the voltage of the AC signal source 48 is sensed by a voltage sensing circuit 50 which provides an electrical input signal sensed by the electronic circuitry of the paging receiver. It is to be understood that the input signal may be used by the paging receiver as an input or the signal may be used as an indicator to turn on or off the paging receiver.

Figure 5A:
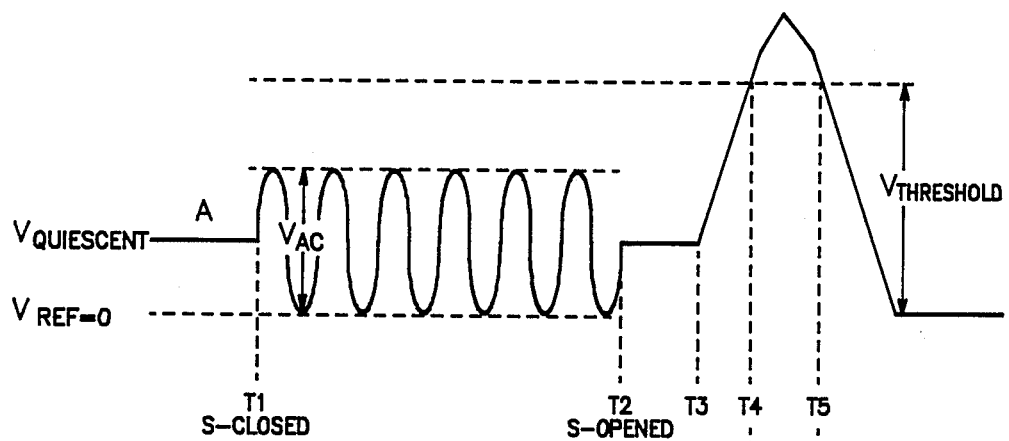
FIG. 5A is a waveform diagram helpful in explaining the operation of the electrical diagram of FIG. 4.
Figure 5B:
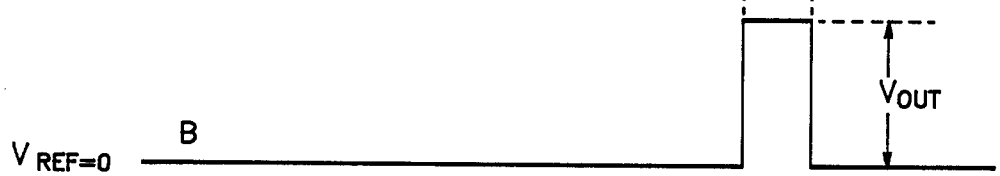
FIG. 5B is a waveform diagram showing the output of the voltage sensing circuit of FIG. 4.

Referring to FIGS. 5A and 5B, there is shown waveforms of the circuitry of FIG. 4 which is helpful in explaining the operation of the dual mode transducer. In FIG. 5A, waveform A represents the electrical signal at point A of FIG. 4. When switch 46 is closed to generate an alert signal, the AC signal source 48 generates a voltage ($V_{AC}$) having a frequency which excites piezoelectric element 14 into mechanical vibration as shown during the time from T1 to T2. At time T2, switch S has been opened. During the period of time T1 to T2, since the amplitude of $V_{AC}$ is not enough to trigger circuit 50, the voltage at point B being the output of the voltage sensing circuit 50 is at a reference level, such as zero. At time T3, manual pressure is applied to the pushbutton to cause the snap action dome to collapse, bringing the inner surface of the dome into stressful contact with the piezoelectric element. At this point, the piezoelectric element responds to the deformation and generates a voltage. The sudden stressful deformation of the piezoelectric element by the force of the snap action dome causes the voltage output of the piezoelectric element to rise above a predetermined voltage threshold level ($V_{threshold}$) At time T4, the voltage sensing circuit senses that the piezoeleotric voltage is greater than the threshold voltage to generate an electrical signal at time T4 as an input signal to the paging receiver.

Figure 6A:
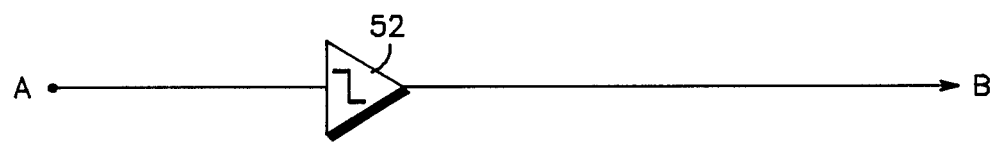
FIG. 6A shows an embodiment of the voltage sensing circuit of FIG. 4 for providing a switching signal.
Figure 6B:
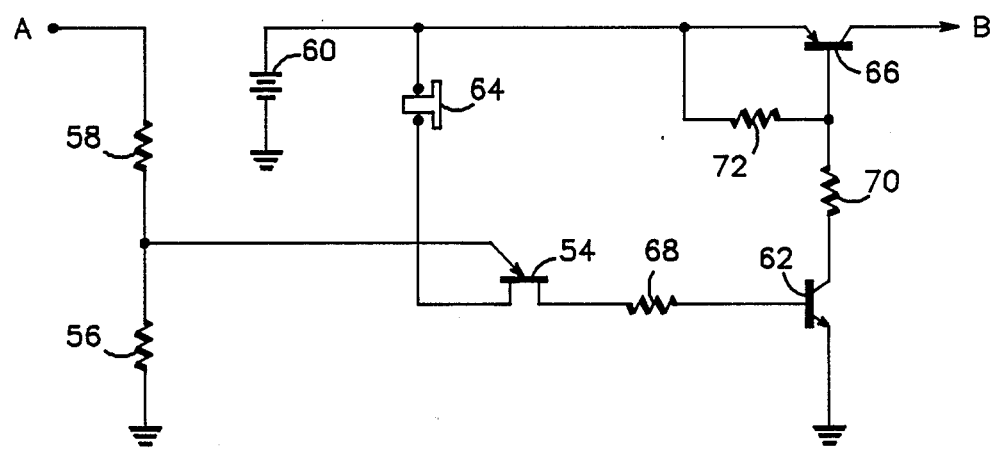
FIG. 6B shows a second embodiment of the voltage sensing circuit of FIG. 4 for providing a switching signal operating only on the voltage generated by the piezoelectric element.

Referring to FIGS. 6A and 6B, there are shown two embodiments of the present invention for the voltage sensing circuit of FIG. 4. FIG. 6A is an embodiment of the voltage sensing circuit operating from the internal power of the paging receiver. FIG. 6B shows an embodiment of the voltage sensing circuit describing an on/off switch powered only by the voltage generated by the piezoelectric element.

In FIG. 6A, a Schmitt trigger 52 is connected at point A of FIG. 5A to produce a voltage out as shown in FIG. 5B. The Schmitt trigger generates an output pulse of constant amplitude as long as the piezoelectric voltage exceeds the threshold voltage. For a longer pulse, the Schmitt trigger may trigger a monostable multivibrator. The circuitry of FIG. 6A operates from the extrinsic power of the paging receiver.

The circuitry of FIG. 6B requires no extrinsic power but operates on the power generated by the piezoelectric element. Thus, when the paging receiver is turned off, power can be removed from all the circuitry. In the circuitry of FIG. 6B, the emitter of a unijunction transistor 54 is connected to a voltage divider formed by resistors 56 and 58 connected to point A. The voltage divider provides a means of adjusting the triggering voltage of the unijunction transistor 54. Upon sensing that the voltage from the piezoelectric element 14 exceeds the voltage threshold, the unijunction transistor 54 is placed in a conductive state which allows current to flow through its bases from battery 60 to transistor 62. Reset switch 64 is initially closed to allow conduction. When enabled, switch transistor 62 conducts which turns on power transistor 66. The subsequent conduction of power transistor 66 allows current to flow from the battery 60 to the electronic circuitry of the paging receiver. Resistors 68-72 provide the proper biasing for transistors 62 and 66. Reset switch 64 is provided to reset the unijunction transistor 54 after power is established from the paging receiver so that the unijunction transistor 54 may sense activation of the piezoelectric element 14. As is understood by one of ordinary skill in the art, the reset switch 64 can be configured in many different ways and in more elaborate electronic configurations rather than a manual reset switch. Thus, the circuitry in FIG. 6B shows a method which generates an activation signal using only the voltage generated by an piezoelectric element.

Thus, there has been shown a dual mode transducer having an output mode for generating an alert signal and an input mode for generating an input signal for a paging receiver or the like. In the output mode, a voltage is applied to a piezoelectric element for generating acoustic energy to provide an alert signal. In the input mode, a slidably retained pushbutton is manually actuated which provides downward pressure on a snap action dome which flexes downwardly into stressful contact with the underlying piezoelectric element. A voltage sensing circuit senses the electrical signal generated from the piezoelectric element to provide an input signal or an activation signal to the electronic circuitry of the paging receiver.

While other certain preferred features of the invention have been shown by way of illustration, many modifications and changes will occur to those skilled in the art. It is, therefore, to be understood that the present claims are intended to cover all such modifications and changes as fall within the true spirit of the invention.

I claim:

1. A dual mode tranducer comprising:
    an actuating means;
    a resilient member responsive to said actuating means;
    a piezoelectric element responsive to mechanical deformation for generating a first electric signal, wherein said resilient member being interposed between said actuating means and said piezoelectric element and being forced by said actuating means for a normal undeflected position to a deflected position, deforms said piezoelectric element to generate said first electrical signal; and further wherein
    the piezoelectric element being responsive to a second electrical signal for generating mechanical vibrational energy; and
    a housing supporting said piezoelectric element, said housing having a resonant cavity and a port for radiating acoustical energy wherein said mechanical vibrational energy is converted to acoustical energy by said resonant cavity and said port.

2. The dual mode tranducer of claim 1, wherein said resilient member comprises a snap action dome such that when said dome is deflected, a surface of said dome deforms said piezoelectric element.

3. The dual mode transducer of claim 2, wherein said dome is comprised of metal.

4. The dual mode transducer of claim 3, further including an insulating element interposed between said dome and said piezoelectric element for preventing electrical conductivity between said piezoelectric element and said dome.

5. The dual mode transducer of claim 2, wherein said dome is plastic.

6. The dual mode transducer of claim 2, wherein said actuating means comprises a manually operated pushbutton for effecting deflection of said dome.

7. The dual mode transducer of claim 6, further including a mounting element having an aperture formed therethrough for effecting slidable movement of said pushbutton, wherein said mounting element is aligned on said housing for positioning said pushbutton on the apex of said dome.

8. The dual mode transducer of claim 2, wherein said dome further includes a peripheral foot portion positionally adjacent the periphery of said piezoelectric element to increase the stress to said piezoelectric element upon contact of said dome with said piezoelectric element.

9. A dual mode transducer comprising:
    a manual actuating means;
    a piezoelectric element responsive to mechanical deformation for generating a first electrical signal;
    a resilient member, responsive to said actuating means and interposed between said actuating means and said piezoelectric element, wherein manual pressure on the actuating means forces the resilient member to collapse bringing the resilient member into contact with the piezoelectric element to deform said piezoelectric element to generate said first electrical signal; and further
    wherein said piezoelectric element responds to a second electrical signal for generating mechanical vibrational energy within the audio frequency spectrum and
    a housing including a resonant cavity for radiating acoustical energy wherein said mechanical vibrational energy is converted to the acoustical energy by said resonant cavity.

10. The dual mode transducer of claim 9, wherein said actuating means comprises a pushbutton and further wherein said transducer includes a mounting element having an aperture therethrough for effecting slidable movement of said pushbutton.

11. The dual mode tranducer of claim 10, wherein said resilient member comprises a snap action dome actuated by force from said pushbutton from a normal undeflected position to a deflected position, said dome returning to its undeflected position upon removal of force from said pushbutton.

12. The dual mode transducer of claim 11, wherein said snap action dome is comprised of metal.

13. The dual mode tranducer of claim 11, further wherein said housing supports said piezoelectric element and said dome, wherein said housing positions the dome relative to the piezoelectric element for effecting a maximum electrical signal from said piezoelectric element upon being deformed by said dome.

14. The dual mode transducer of claim 13, further including a voltage sensing circuit responsive to the output of said piezoelectric element comprising a voltage measuring device for generating a third electrical signal whenever the first electrical signal exceeds a predetermined value.

15. The dual mode transducer of claim 14, wherein the voltage measuring device comprises a triggering device powered by an extrinsic power supply.

16. The dual mode transducer of claim 14, wherein the voltage measuring device comprises a triggering device powered by the electrical signal generated by said piezoelectric element.

17. A method for generating mechanical energy and an electrical output signal from a transducer, the transducer having an actuating means, a resilient member responsive to the actuating means, and a piezoelectric element, said method comprising the steps of:
    (a) activating the actuating means to apply force to the resilient member;
    (b) deforming said piezoelectric element by forcing the resilient member from a normal undeflected position to a deflected position, wherein the resilient member, being interposed between the actuating means and the piezoelectric element, returns to the undeflected position upon removal of the force, the piezoelectric element generating a first electrical signal in response thereof;
    (c) sensing the first electrical signal in a voltage sensing circuit to generate the electrical output signal in response thereof; and
    (d) generating the mechanical energy signal by supplying a second electrical signal to the piezoelectric element for generating mechanical vibrations in the piezoelectric element.

18. The method of claim 17 wherein step (b) of deforming further includes applying the force to generate a first electrical signal greater than the second electrical signal.

19. The method of claim 18 wherein step (c) of sensing further includes the step of generating the electrical output signal with the voltage sensing circuit whenever the first electrical signal exceeds a predetermined value.

20. The method of claim 19 further including the step of powering the voltage sensing circuit with the first electrical signal.

21. The method of claim 19 further including the step of powering the voltage sensing circuit with an extrinsic power supply.

22. The method of claim 17 wherein step (d) of generating further includes converting the mechanical vibrations into acoustic energy by enclosing the piezoelectric element in a housing having a resonant cavity and an output port.

23. A dual mode transducer comprising:
an actuating means;
a resilient member responsive to said actuating means;
a piezoelectric element responsive to mechanical deformation for generating a first electric signal, wherein said resilient member being interposed between said actuating means and said piezoelectric element and being forced by said actuating means from a normal undeflected position to a deflected position, deforms said piezoelectric element to generate said first electrical signal; and further wherein
the piezoelectric element being responsive to a second electrical signal for generating mechanical vibrational energy; and
a voltage sensing circuit responsive to the output of said piezoelectric element, said voltage sensing circuit comprising a voltage measuring device for generating a third electrical signal whenever the first electrical signal exceeds a predetermined value.

* * * * *